United States Patent [19]

Arnett et al.

[11] 4,068,217
[45] Jan. 10, 1978

[54] ULTIMATE DENSITY NON-VOLATILE CROSS-POINT SEMICONDUCTOR MEMORY ARRAY

[75] Inventors: Patrick Clinton Arnett, Putnam Valley; Joseph Juifu Chang, Poughkeepsie, both of N.Y.

[73] Assignee: International Business Machines Corporation, Armonk, N.Y.

[21] Appl. No.: 592,002

[22] Filed: June 30, 1975

[51] Int. Cl.$^2$ .................................................. G11C 11/40
[52] U.S. Cl. ................................ 365/182; 340/147 R; 365/218; 357/54
[58] Field of Search ............... 340/173 PP, 173 CA, 340/173 R, 147 R; 357/54, 23, 41

[56] References Cited

U.S. PATENT DOCUMENTS

| 3,716,469 | 2/1973 | Bhatt et al. ............................ 357/54 |
| 3,760,242 | 9/1973 | Duffy et al. ............................ 357/54 |
| 3,838,405 | 9/1974 | Arnett et al. ..................... 340/173 R |
| 3,860,461 | 1/1975 | Robinette, Jr. ......................... 357/54 |
| 3,906,539 | 9/1975 | Sauerman et al. ..................... 357/54 |
| 3,931,632 | 1/1976 | Uchida et al. .......................... 357/54 |

*Primary Examiner*—Marshall M. Curtis
*Attorney, Agent, or Firm*—Roy R. Schlemmer, Jr.

[57] ABSTRACT

An extremely high density memory array in which every intersection between two insulated orthogonal sets of drive lines define a nonvolatile memory device is described. Each device utilizes the area directly under the intersection of sets of lines to selectively store charges therein under control of suitable writing pulses. Reading is accomplished utilizing capacitive coupling through the device. The array comprises insulated metallic word lines orthogonal to doped bit lines defined within the surface of a semiconductor body. The insulation between the word lines and the bit lines has a dual charge state and is capable of storing charges. A unique structure is utilized whereby a highly doped layer is formed at the surface of the semiconductor body and of the same conductivity type as the body. The bit lines are composed of two distinct layers of an opposite conductivity type to that of said body wherein the layer closest to the surface is less highly doped. The selective biasing of word and bit lines causes charges to be injected into the insulation immediately between the two lines which injected charges alter the capacitance characteristics of the device and thus the signal coupling characteristic between the word and bit lines. During the write operation, an avalanche breakdown at the junction is caused to occur by heavily biasing the junction, and charge carriers are injected into the overlying insulator. The charge carriers so injected remain localized in the insulator immediately between the two lines with negligible fringing into the region outside this intersection and thus do not disturb the information on adjacent bit lines which allows extremely close placement of such adjacent lines. To erase, a voltage is supplied to cause the injected carriers to be driven out of the insulation back into the substrate. As stated previously, the reading operation utilizes the change in the coupling capacitance with a charge stored in the device and comprises introducing a signal on one line well below the breakdown voltage of the device so that the stored charge is in no way affected by any number of reading operations and detecting said signal on the other line, if coupled through.

9 Claims, 6 Drawing Figures

ULTIMATE DENSITY NON-VOLATILE CROSS-POINT SEMICONDUCTOR MEMORY ARRAY

BACKGROUND OF THE INVENTION

The present invention relates to semiconductor memories and, more particularly, to electronically nonvolatile stored charge semiconductor memories adapted for use in an extremely high density integrated circuit memory array structure.

Field effect transistors utilizing charges stored in dual insulators overlying the channel of the FET are known to the art. In these field effect transistors the basic gate dielectric structure of the FET is provided with a carrier trapping interface between a first insulator, usually an oxide, and a second insulator, usually a trapping material having different dielectric properties. Silicon nitride and silicon dioxide dielectric materials are commonly employed in combination as the two insulators.

Such charge accumulation is due to the different conductivities of the layers and is retained in the insulating layers when the applied voltage is removed because the current densities in the layers are nonlinear functions of the electric field intensity.

Since the present invention relates particularly to diffused semiconductor structures utilizing metallic lines overlying the diffusion and insulated therefrom by a dual insulator structure, it should be mentioned that there are still other structures which are not field effect transitors that utilize dual insulators and diffusions in semiconductor bodies. For example, IBM Technical Disclosure Bulletin, Volume 12, No. 1, June, 1969, on Page 202, described a capcative storage cell utilizing diffusions in a semiconductor body which diffusions are covered by metallic lines insulated from the diffusions by layers of silicon dioxide and silicon nitride. IBM Technial Diclosure Bulletin, Volume 14, No. 12, May, 1973, discloses a single diffusion metal-nitride-oxide semiconductor device which utilizes trapping in the oxide layer by causing the surface adjacent to the diffusion to be either inverted or noninverted thus varying the capacitance of the diffusion. U.S. Pat. No. 3,446,955 teaches that the breakdown voltage of a junction diode can be varied by applying a suitable bias to an electrode overlying, but insulated from the junction. U.S. Pat. No. 3,428,875 teaches that the flatband voltage of an MOS capacitor can be precisely varied by placing two layers of different dielectric material between the body of the semiconductor material and the overlying gate electrode.

U.S. Pat. No. 3,838,405, filed by the inventors of the present application and entitled "Nonvolatile Diode Cross Point Memory Array," discloses a semiconductor integrated circuit memory structure utilizing word and bit lines orthogonally disposed with respect to each other and wherein stored carriers injected into the region adjacent to the crossover area by biasing the junctions formed to avalanche breakdown conditions wherein the read-out operation occurs as a result of opposite biasing to break down in the opposite direction to provide read-out. The structure disclosed in this patent is similar to that of the instant invention but differs in the doping levels within the bit lines and in the surface of the semiconductor body adjacent to the oxide layer. The result is that in the patented device the carrier storage occurs in a region adjacent to but essentially outside of the word and bit line intersection areas. Thus the ultimate density of such an array is limited by this fringing effect. Further, in certain circumstances, the read-out operation can in turn cause considerable degradation of the carriers stored in the device limiting the non-volatile life of the cell.

SUMMARY AND OBJECTS

The present invention is directed toward an integrated circuit memory element and array capable of storing non-volatile information as a charge in a charge storage medium such as a dual layered dielectric. The element comprises a metal line disposed across a diffused line in a semiconductor body, said semiconductor body being coated with dielectric layers having different conductivities. Selected voltages are utilized to write information into the cell by causing an avalanche breakdown of diffused p-n junctions to occur. This in turn causes charges to be injected into the insulator immediately between the diffused and the metal lines. This injected charge in turn causes the capacitive coupling between the diffused and the metal lines to change materially. Different applied voltages can be used to erase the information by removing the charges from the insulative layers between the two lines.

The memory of the present invention may readily be made in an array form, wherein the metal lines and the diffused lines are arranged substantially orthogonally with respect to each other. This memory array may in turn readily be incorporated into a three-dimensional random access memory by utilizing a suitable plurality of layers. Each layer array comprises a semiconductor body of one conductivity type. A first set of lines is diffused therein of an opposite conductivity type material. Both the semiconductor body and the diffused lines each have a layer of a higher concentration (+ region) material thereon, on the surface of the substrate and at the bottom of the diffused bit lines. A charge storage insulator of uniform thickness is then placed on the surface of the body over the diffused lines. Subsequently a set of metallic lines is disposed over the insulator substantially orthogonally to the diffused bit lines. Each crossing of a metallic line and a diffused line comprises a memory storage cell. Due to the unique physical characteristics of the present invention, the charge storage region lies in the area actually between the two lines and has substantially no fringing effect around the edges thereof. This characteristic is believed to provide an ultimate potential packing density even exceeding that of the previously referenced patent of the same inventors, U.S. Pat. No. 3,838,405.

It is a primary object of the present invention to provide a non-volatile memory element utilizing the region directly between the intersecting memory lines as the storage area.

It is a further object of the present invention to provide a random access memory array as set forth above, having an extremely high cell packing density.

It is yet another object of the present invention to provide a cross point memory cell composed of a metallic line, a diffused line, and a dual dielectric separating the lines wherein said diffused line is a diffusion of a first conductivity type into a semiconductor body of an opposite conductivity type.

It is a further object of the present invention to provide such a cross point memory cell wherein the semiconductor body and the diffused line each has a layer therein, having a higher impurity concentration (+ region) than the regions adjacent thereto but of the same conductivity type.

It is another object of the invention to provide such a memory cell capable of true non-destructive read out operation.

It is a still further object of the present invention to provide such a semiconductor memory array, utilizing capacitive coupling between the lines as an indication of the presence or absence of a stored charge therein.

DESCRIPTION OF THE DRAWINGS

These and other objects, features and advantages of the present invention will be more fully appreciated from the following detailed description of a preferred embodiment of the present invention taken in conjunction with the drawings in which.

DESCRIPTION OF THE INVENTION

The objects of the present invention are accomplished in general by a semiconductor storage element, comprising a semiconductor substrate of a first conductivity type having a first impurity concentration therein. A first line is diffused in the surface of said substrate of a conductivity type opposite to that of the said substrate, having a first impurity concentration. There are two thin layers formed in said substrate and said diffused line respectively, each being of the same conductivity type as the host material but of a second impurity concentration greater than that of said host regions (+). A thin uniform oxide film covers said substrate and diffused line and a thin nitride film covers said oxide film. Metallic lines orthogonally disposed with respect to said diffused line are located on the surface of said nitride layer wherein the region lying directly between the diffused line and the metallic line comprises the memory storage element.

The particular physical configuration of the storage cell, as will be described more fully subsequently, causes charges to be injected into the dielectric oxide/-nitride layers lying directly between the two lines when an avalanche breakdown of the p-n junctions formed between the line and the surrounding substrate are suitably biased. When there is no charge stored within the dielectric layer there is a considerable capacitive coupling between the metal line and the diffused line and a small signal applied to one line may be readily detected in the other by suitable sense amplifiers or the like. In a preferred embodiment of the invention a small AC signal may be impressed on the DC read signal. An excellent noise discrimination may be obtained in this way.

Since the read operation utilizes a small signal well below the breakdown level of the device, the charge stored therein remains virtually indefinitely and is not necessary to rewrite the element as is the case with conventional magnetic and semiconductor memories.

Figure 1A:
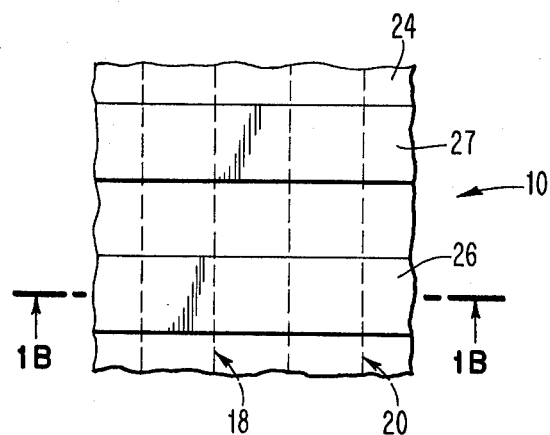
FIG. 1A comprises a plan view of a small segment, i.e., four storage elements of a semiconductor memory array constructed in accordance with the teachings of the present invention.
Figure 1B:
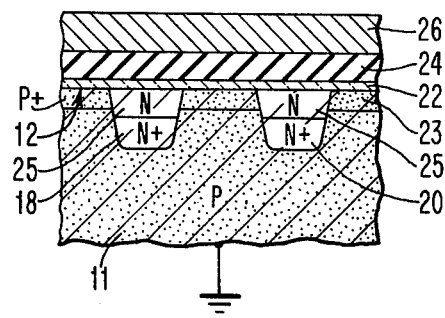
FIG. 1B comprises a cross-sectional view taken along the line of B—B of FIG. 1A, showing two individual cells.
Figure 1C:
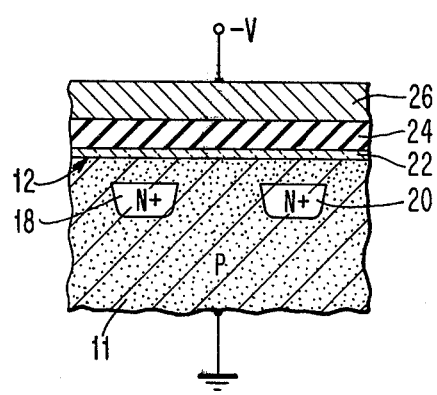
FIGS. 1C and 1D are cross-sectional views taken along line B—B of FIG. 1A and are similar to FIG. 1B but show the effective configuration of the device during two different biasing conditions for erasing and writing operations respectively.
Figure 1D:
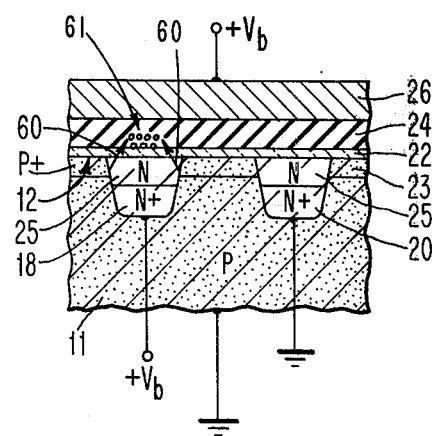

The structure of the device is indicated quite clearly in FIGS. 1A and 1B. It being noted that FIGS. 1C and 1D are subtantially identical to 1B but are used to identify two of the modes of operation as will be set forth subsequently. The device itself consists of a substrate 11 formed as shown of a p-type semiconductor material having two bit lines 18 and 20 diffused therein. It will be noted that these bit lines are formed from two layers of the same conductivity type but having different doping levels. The upper level, or layer 25, has a lower doping level than the lower n+ region also shown by the numerals 18 and 20. It will also be noted that an upper layer 23 of the substrate material is doped to a p+ level thus forming nominal p+-n junctions at each side of each of the diffused bit lines. A uniform silicon oxide layer 22 covers the entire array and a second insulative layer 24 of silicon nitride also overlays the entire diffused bit line and substrate structure. Finally, word lines shown as 26 and 27 in FIG. 1A intersect at substantially right angles the diffused bit lines 18 and 20. These may conveniently be made of aluminum and deposited by techniques well known in the art.

The operation of the device will be described more fully subsequently but briefly comprises the application of a suitable low voltage to a selected bit and word line to appropriately bias a particular memory cell to the 'write' state. When desired, charges are injected into the insulative layers between said intersecting bit and word line to change the capacitive coupling between these lines. Subsequent reading operations utilize this change in capacitance coupling to effect sensing of the charge state of that particular memory element.

It is significant from the standpoint of the ultimate density achievable with the present invention that the formation of the two layers in the substrate, i.e., the p+ layer 23 and the n layer 25 that carriers are injected well into the insulative layers underlying the word and bit lines. This is contrasted with the storage phenomenon in U.S. Pat. No. 3,838,405 of the present inventors wherein the charge area is located in the area overlying the p-n junction itself and thus causes charge fringing well out into the area outside of the boundaries under the line intersections. The reason for this is under reverse bias in a highly assymetric p-n junction (one side being much more heavily doped than the other) the depletion is almost entirely on the lightly doped side and that hot carriers are injected into the insulating layer from the depletion region only. In the prior U.S. Pat. No. 3,838,405 the depletion region is outside of the line intersection with the result that there is fringing of this charge with such a structure. In the present structure this depletion region is directly under the intersection of the lines which eliminates fringing.

A set of particular doping levels as well as some of the criteria utilized in arriving at these levels is set forth below. It should, of course, be assumed that considerable latitude is possible in these design levels which would still produce a device working essentially in accordance with the teachings of the present invention.

The doping of the substrate 11 (p-region) should be as light as possible to minimize the n/n+ bit line capacitance, but should be heavy enough to prevent voltage punch-through between bit lines. If the gated breakdown voltage between the n/n+ regions and the p+/p regions is V and the distance between bit lines is d, then the substrate doping concentrations, $N_P$, is given by:

$$N_P > 2 K V/q d^2$$

if V is to be 10 volts and $d$, 1μ, the doping $N_P$ should be larger than $1.3 \times 10^{16}$ cm$^{-3}$.

The doping of the n region 25 should be light enough so that a voltage can be applied across the MNOS structure to invert this n region without discharging the charge stored in the insulator 24. This means that the doping $N_n$ should be less than $\sim 10^{18}$ cm$^{-3}$. However, $N_n$ should be higher than $N_p$, so that when breakdown occurs between the n/n+ bit line and the p+/p field region, it occurs at the p+-n junction, not at the n+-junction. Thus, $$N_P < N_n < 10^{18} cm^{-3}.$$

The n+-region (lower portion 18-20 of the bit lines) should be doped as heavily as possible (heavier than $10^{19}$ cm$^{-3}$) to minimize the bit line resistance, but the doping should not be so heavy as to effect the crystal structure of the n-region.

The doping of p+-region 23 should be heavy enough to prevent inversion to take place under the contemplated operating conditions, and also to insure breakdown to take place at the p+-n junction, not n+-p junction. This doping concentration is about $10^{19}$/cm$^{-3}$ or higher.

The fabrication for the array is quite straight forward, a preferred way would be as follows. A thin oxide layer is first grown over the substrate 11 and then boron doped oxide and pure oxide are pyrolitically deposited. (Not illustrated). The bit lines, i.e., 18 and 20, are photolithographically defined. Either a photoresist or some other additional material is placed on top of the oxide layers to mask the ion implantation to be done next. Arsenic, phosphorus or antimony is ion implanted to form the n/n+ bit lines. the p+ layer 23 is formed by boron diffusion from the doped oxide during the annealing process for the ion implantation, as is well known. Then the oxide layers are stripped off and the reaminder of the MNOS structure is formed as set forth below over the entire array area.

A layer 22 of silicon dioxide preferably 15 to 25 angstroms thick is formed thereon. This layer 22 may be thicker, for example, 100 angstroms, and may be produced by any suitable known so-called thermally grown process. The thickness is not critical. Following the establisment of this silicon dioxide layer 22, a silicon nitride layer 24 having a thickness of, say 500 angstroms, is formed on the layer 22. In practice, this layer 24 can range in thickness between 250 angstroms and 1,000 angstroms. One particular method of forming such a silicon nitride layer known to the semiconductor art comprises a treatment in which silane and ammonia are mixed in a carrier gas stream of hydrogen and introduced into a chamber containing the silicon body at a temperature of about 800° C. At this temperature a reaction occurs resulting in the formation of the silicon nitride layer 24 on the silicon dioxide layer 22. Following the creation of this silicon nitride layer 24 a deposit of metal such as aluminum about 8,000 angstroms thick is laid down on the surface of the silicon nitride layer 24. Such an aluminum layer may be created by any well-known process such as evaporation or by sputter deposition.

Once the aluminum layer has been laid down over the array, a photoresist mask (not shown) is provided over the surface of the aluminum and exposed and developed and the layer of aluminum etched in accordance with well-known techniques such that a series of metal word lines 26, 27, 28, and 29 (See FIG. 2) are formed across the surface of the semiconductor body 11. Each of these word line 26, 27, 28, and 29 is coupled to a respective word driver circuit 30, 31, 32, and 33. Each word driver circuit functions to provide selected voltages to the respective word line to which it is coupled. Each word driver circuit 30, 31, 32, and 33 is further coupled to a decoded circuit 34, whicn, in turn, is coupled to an address register (not shown) which provides a set of address signals to the decoder on lines 35.

The diffused bit lines 14, 16, 18, and 20 hereinafter referred to as bit sense lines, are coupled at one end to respective conventional, voltage sensitive, sense amplifiers 37, 38, 39, and 40 and at the other end thereto to respective switches 41, 42, 43, and 44. Each switch 41, 42, 43, and 44 is a three-position switch. The first position of each switch is connected to ground; the second position of each switch is connected through a bit line driver 51 to a decoder 52, so that selected voltages may be impressed upon the bit sense line by suitable decoded signals; and the third position of each switch is open, such that the bit sense line to which the switch is coupled can be isolated from both ground and the bit line driver; that is, left electrically floating.

Each crossing of each metal word line 26, 27, 28, and 29 over a diffused bit sense line 14, 16, 18, and 20 defines a separate and distinct memory cell, D1 to D16. Thus, the array shown in FIG. 2 has 16 distinct memory cells D1 to D16, one at each intersection of the word lines and the bit sense lines.

The capacitive coupling between the word lines 26-29 and the bit lines 14-20 can be changed by introducing charge into the dielectric interface between a selected bit sense line and a selected crossing word line. This introducing of charge into the dielectric over the diffused bit line and under the metallic line writes the cell defined by the intersection of the lines by altering the capacitance between the lines.

The introducing of charge into the interface is deemed to be a write operation and is accomplished by driving the rectifying junction at the crossing of the word an bit sense line into avalanche condition so that highly energetic charges are injected from the avalanching junction into the dielectric interface. These carriers are only injected into the dielectric interface immediately above the point of junction breakdown and do not migrate therefrom. Thus in the charged state the word line is effectively uncoupled from the bit line whereas in the uncharged state they are capacitively coupled.

Erasing of the cell consists of biasing the intersecting word and bit line such that the stored charges in the cell are driven from the interface back into the body 11.

The operation of the memory element will now be described in greater detail with reference being made to FIGS. 1A through 1D. As stated previously a two by two memory array is shown in FIG. 1A and in cross sectional view, in FIG. 1B. The device is shown to have an MNOS structure; other structures such as MAOS, floating-gate, ferroelectric sandwich, etc. can all be used. With the structure shown in FIG. (1B-D) to erase a word, a negative voltage pulse is applied to the selected word line while all the other word lines and all bit lines are kept at ground potential. The negative voltage inverts the n-region of the n/n+ bit lines and thus the entire region under the selected word line is at the substrate potential which may be the ground (FIG. 1C). Let us assume that the erased state is a charge-free state for the insulator layer 24. This may also be arbitrarily called the "1" state. Writing is done by avalanche injection of electrons from the p+- junctions at the selected bit locations. The p+-n junctions are formed between the p+ field surface doping and the n/n+ bit lines. The voltage biases are such that avalance breakdown is prevented at all other bit locations under the same word line and all bit locations under all other word lines. Like any other non-volatile memory array, detailed design calculations and adjustments are needed to work out the proper voltage levels to achieve selective erase and write without disturbing the already stored information.

Figure 3:
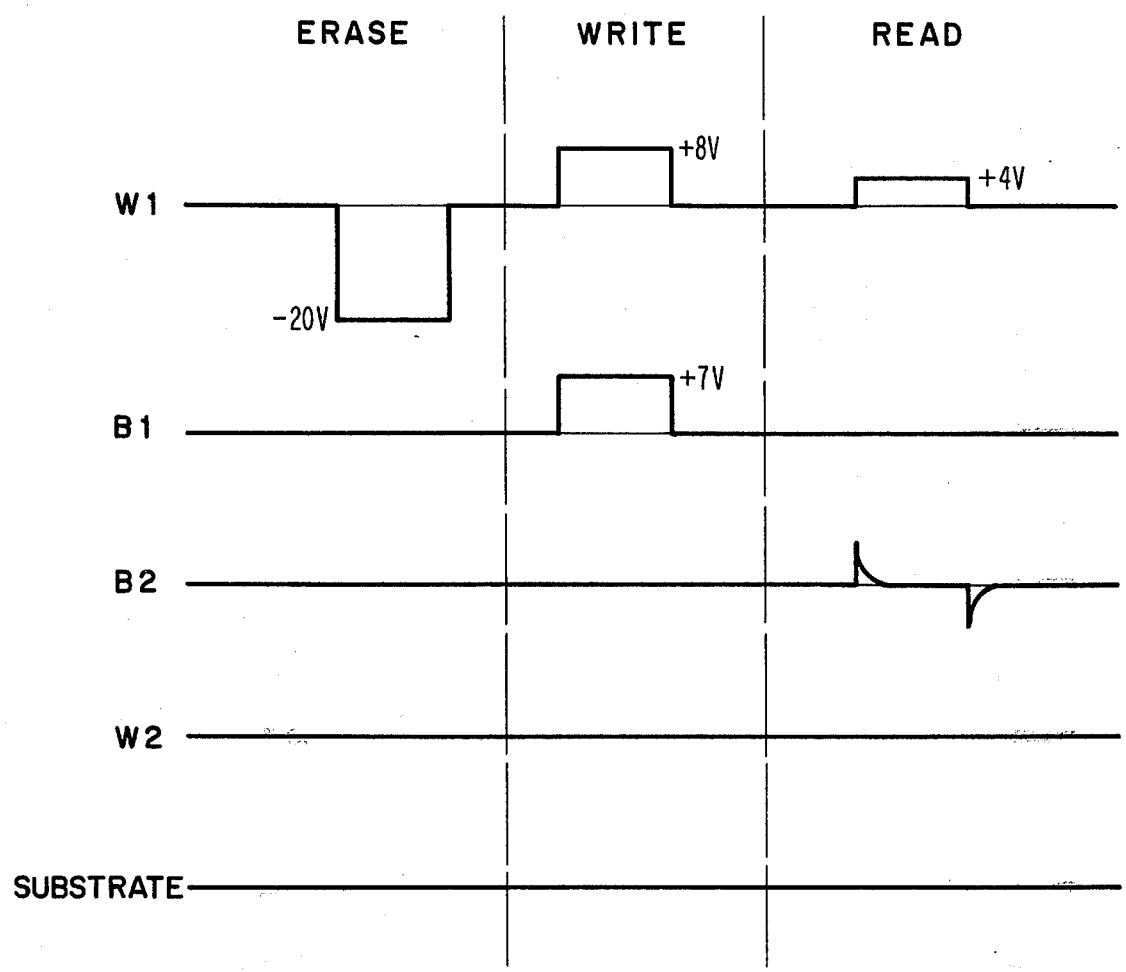
FIG. 3 shows a series of wave forms which would be applied to the specific memory configuration shown in FIG. 1A to effect erasure, writing, or reading in a selected storage cell.

To illustrate the principle, the writing can be accomplished as shown in FIG. 1D. A positive voltage pulse $V_w$ is applied to the selected word line (See FIG. 3) while all other word lines remain grounded. A positive voltage, $v_b$, is applied to the bit lines 18 which control the bit locations to be written into "0" (charged) state. The substrate and all the other bit lines 20 are kept at ground potential. The two positive voltages cause the p+-n junctions at the selected locations to break down and electrons are thus injected into the insulator structure well under the word lines as illustrated by the arrows 60 the electrons being designated by the numeral 61. The negative charge in the insulator which represents "0" state, causes the n region 25 underneath it to invert and this isolates the n+ bit line 18 from the word line 24 even when a moderate positive read voltage is applied to the word line. A bit location 20 at "1" state, having either positive charge or zero charge in the insulator structure, will have either accumated or neutral n surface under it and the word line is, therefore, coupled to the bit line at that location. To read a single pulse or preferably a train of short positive pulses may be applied to the selected word line. Bit locations at "1" state will couple the signal to the respective bit lines and those at "0" state will not. To reduce the effect of bit line capacitance, the read voltage may be applied to the bit lines, sensing done at the word lines, and proper biases used to reduce undesirable coupling.

Figure 2:
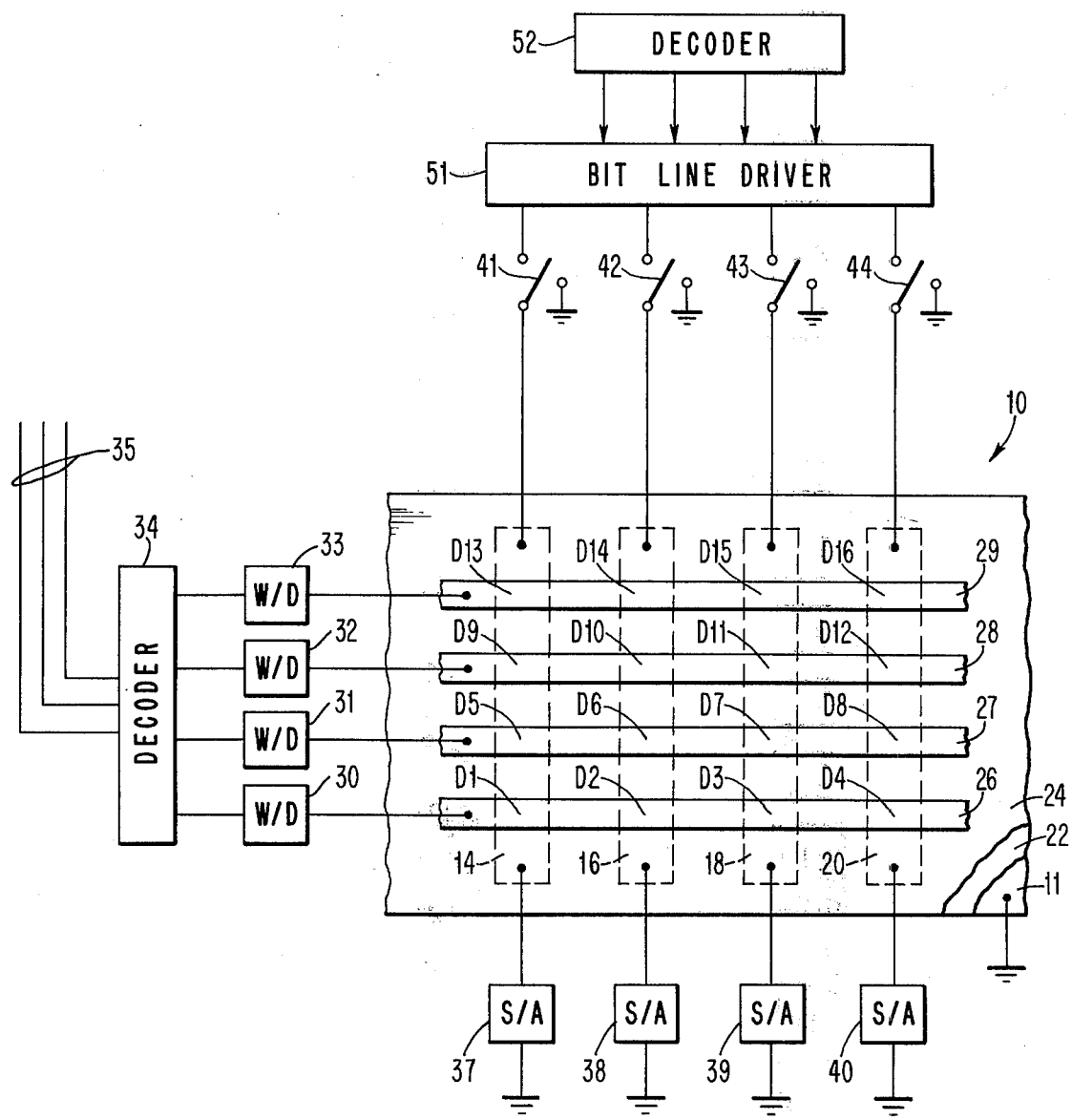
FIG. 2 is a plan view of an integrated circuit memory array formed in accordance with the present invention.

The previous description of the operational characteristics of the single element insofar as the way it is erased, written, and read is, of course, identical for all of the individual cells or elements. For a more specific description of the operation of the system aspects of an overall array as shown in FIG. 2, reference is made to the previously issued U.S. Pat. No. 3,838,405 of the applicants. The basic concepts of addressing the array, writing and erasing are substantially the same as for said above referenced patent. The reading, of course, is somewhat different since the read pulse itself is either coupled through the cell or not coupled depending on the charge state of the cell. The switching and biasing operations are actually simplified as it is only necessary to place the read signal on one of the lines since no biasing to avalanche breakdown is required in the present invention. It will, of course, be understood that the existence of a charge in a given memory element may be arbitrarily utilized to represent a binary "one" or a binary "zero."

Accordingly, when it is desired to read a particular word line with the present invention, it is only necessary to place the required voltage (i.e., +4 volts in the disclosed embodiment) with or without an AC component on the desired word line whereby the sense amplifiers 37–40 connected to the bit lines will receive an output signal depending upon whether or not the particular memory cell has a charge stored therein. Again, the write and erase operations for the two structures are very similar.

As stated previously the specific doping levels and/or resistivities for the p/p+ regions in the semiconductor substrate 12 and the n/n+ regions in the diffused lines may vary somewhat from the specific examples given previously.

It should also be clearly understood that while the substrate is illustrated as a p-doped material with a p+ layer thereon, it could equally be an n-doped substrate having an n+ layer 23. Further, the diffused bit lines could obviously be p/p+ wherein the layer 25 adjacent the surface of the diffused line would be of a p-type conductivity determining impurity.

The relative thickness of the two layers (23 and 25) in the surface of the substrate and the bit line is such that the layer in the bit line is somewhat thicker so that there will be no possibility of a p+/n+ junction being formed.

While the invention has been particularly shown and described with reference to the illustrated embodiments thereof, it will be understood by those skilled in the art that the foregoing and other changes in form and details may be made therein witout departing from the spirit and scope of the invention.

What is claimed is:

1. A non-volatile semiconductor memory storage device comprising a body of semiconductor material of a first conductivity type,
    a conductive line defined within a surface of said body of an opposite conductivity type from said body, said conductive line being composed of two distinct layers one more highly doped than the other, the more highly doped layer being the most remote from the surface of said body,
    a thin layer at the surface of said body defining a more highly doped region than the remainder of said body and of the same conductivity type as said body,
    an insulative layer disposed over the surface of said body containing said conductive line,
    a metallic line located on the surface of said insulative layer intersecting with said conductive line, said insulative layer lying between said intersecting lines and defining a charge storage area,
    a rectifying junction defined by the interface between said highly doped layer at the surface of said body and the lightly doped layer at the surface of said conductive line, said rectifying junction comprising the means through which charge carriers may be injected into said charge storage area.

2. A memory storage device as set forth in claim 1 wherein said insulative layer comprises a first oxide layer and a second nitride layer.

3. A memory storage device as set forth in claim 2 wherein said first layer is silicon oxide an said second layer is silicon nitride.

4. A memory storage device as set forth in claim 1 including means to test the charge storage state of said charge storage area and thus its capacitive coupling, comprising means for placing a read signal on one of said lines and sensing the presence or absence of a signal on the other line said presence or absence of a signal being indicative of an uncharged or charged state of said charge storage area respectively.

5. A memory storage device as set forth in claim 4 wherein said signal placing means comprises means for placing a series of short closely spaced pulses on said one line whereby a similar series of pulses produced in the other line may be detected.

6. A memory storage device as set forth in claim 4 including erase means for biasing said junction to remove charge carriers previously injected into said charge storage area.

7. A memory storage device as set forth in claim 3 wherein said body comprises p-type silicon having a p+ layer thereon and said conductive line defined within said body comprises a lower layer of n+ silicon having a layer of n type silicon on the surface thereof said layer of n silicon in said line being thicker than said p+ silicon layer on said body.

8. A memory storage device as set forth in claim 7 wherein the doping level $N_P$ of the semiconductor body portion, assuming a breakdown voltage between the p/p+ layers as 10 volts and the spacing between the adjacent conductive lines is 1 micron, is defined by:

$$N_P > 5.2 \times 10^{16} \text{cm}^{-3},$$

the doping level of the p+ layer $N_{P^+} > 10^{19} \text{cm}^{-3}$,
the doping of the n+ line $N_{n^+} > 10^{19} \text{cm}^{-3}$,
the doping level of the n layer in the conductive line $N_n$ is defined as:

$$p < N_n < 10^{18} \text{cm}^{-3}.$$

9. A memory array of storage devices including a plurality of parallel conductive lines defined in the surface of a semiconductor body said semiconductor body comprising a substrate layer, and incuding a plurality of closely spaced metal lines on the surface of said body orthogonally disposed with respect to said conductive lines whereby a plurality of individual storage devices are defined by the intersections of said metal lines and said conductive lines, wherein each said storage device comprises said body of semiconductor material being of a first conductivity type, each of said conductive lines defined within the surface of said body being of an opposite conductivity type from said body, said conductive lines being composed of two distinct layers one more highly doped than the other, the more highly doped layer being the most remote from the surface of said body, a thin layer at the surface of said body defining a more highly doped region than the remainder of said body and of the same conductivity type as said body, an insulative layer disposed over the surface of said body containing said conductive lines, each said metallic line located on the surface of said insulative layer intersecting with at least one conductive line, said insulative layer lying between the intersection of said orthogonally disposed conductive and metallic lines to define a charge storage area, a rectifing junction defined by the interface between said highly doped layer at the surface of said conductive line, said rectifying junction comprising the means through which charge carriers may be injected into said charge storage area, and means for selectively applying writing, reading and erasing signals to said two sets of lines whereby selective addressing of a particular charge storage area may be effected.

* * * * *